United States Patent [19]

Donhowe et al.

[11] Patent Number: 5,097,299
[45] Date of Patent: * Mar. 17, 1992

[54] MULTI-BANDGAP SINGLE DUAL FUNCTION LIGHT EMITTING/DETECTING DIODE

[75] Inventors: Mark N. Donhowe, Newark, Del.; Shekhar Wadekar, Beacon, N.Y.; Robert G. Hunsperger, Newark, Del.

[73] Assignee: University of Delaware, Newark, Del.

[*] Notice: The portion of the term of this patent subsequent to Aug. 14, 2007 has been disclaimed.

[21] Appl. No.: 504,867

[22] Filed: Apr. 5, 1990

[51] Int. Cl.$^5$ .................... H01L 31/12; H01L 31/16; H01L 29/161
[52] U.S. Cl. ......................... 357/19; 357/16; 357/20; 357/30
[58] Field of Search ............... 357/19, 30 E, 20, 30 R

[56] References Cited

U.S. PATENT DOCUMENTS

| | | | |
|---|---|---|---|
| 3,952,265 | 4/1976 | Hunsperger | 357/19 |
| 4,295,148 | 10/1981 | Marine et al. | 357/30 |
| 4,450,567 | 5/1984 | Scifres et al. | 357/30 |
| 4,773,074 | 9/1988 | Hunsperger et al. | 357/19 |
| 4,775,881 | 10/1988 | Ploog et al. | 357/20 |
| 4,790,635 | 12/1988 | Apsley | 357/30 |
| 4,910,571 | 3/1990 | Kasahara et al. | 357/19 |
| 4,948,960 | 8/1990 | Simms et al. | 357/19 |
| 4,989,051 | 1/1991 | Whitehead et al. | 357/19 |

FOREIGN PATENT DOCUMENTS

| | | | |
|---|---|---|---|
| 53-116792 | 10/1978 | Japan | 357/19 |
| 63-136580 | 6/1988 | Japan | 357/30 |

*Primary Examiner*—Andrew J. James
*Assistant Examiner*—Daniel N. Russell
*Attorney, Agent, or Firm*—Connolly and Hutz

[57] ABSTRACT

The invention relates to a semiconductor diode capable of performing the dual functions of emission and detection of optical signals. The diode can be used in a bidirectional optical communication link alternating between transmitting and receiving optical signals. In particular, the structure is of a light emitting diode for emission and a photodiode for detection. The invention is a semiconductor p-n junction single heterostructure diode which can operate efficiently as a light emitting diode (LED) when a forward bias voltage is applied and as a light detecting photodiode when a zero or a small reverse bias voltage is applied.

9 Claims, 4 Drawing Sheets

MULTI-BANDGAP SINGLE DUAL FUNCTION LIGHT EMITTING/DETECTING DIODE

INTRODUCTION

This invention relates to a semiconductor diode device which functions both in transmitting and receiving optical signals. More particularly it relates operating in emission under forward bias and in detection with a small reverse bias or none.

DESCRIPTION OF THE DRAWINGS

FIGS. 1 and 2 depict prior art.

BACKGROUND OF THE INVENTION

1. Field of the Invention

Figure 1:
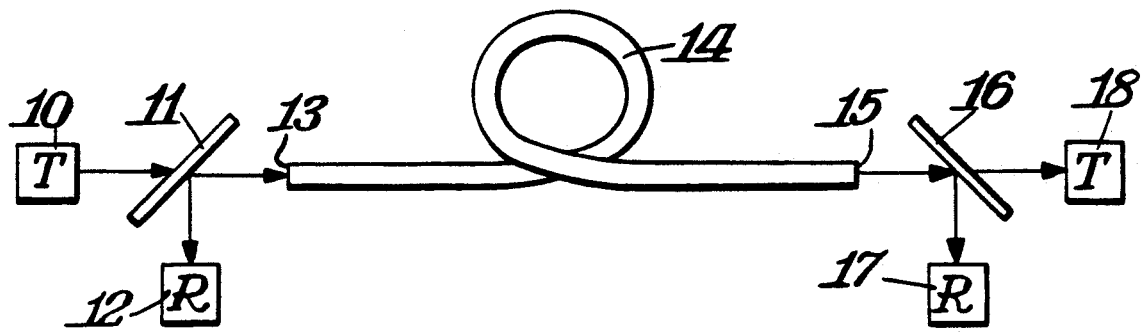
FIGS. 1, 2 and 3 are illustrations depicting optical fiber communications systems.
Figure 2:
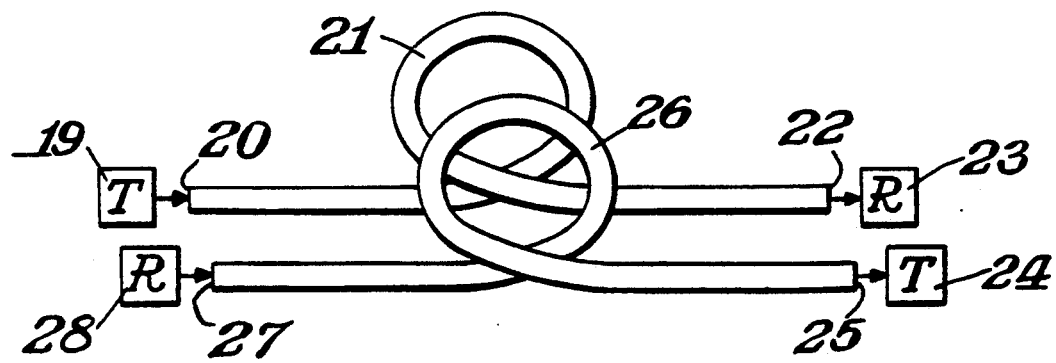

Conventional bi-directional optical fiber communication systems use separate transmitters and receivers at each end of the fiber transmissive medium. Two such systems are illustrated in FIGS. 1 and 2. An example of one such system is shown in FIG. 1. Light transmitter source 10 emits light which travels toward beamsplitter 11 where 50% of the light is directed away from light receiver 12 and the remaining 50% of the light is coupled into the near end of the optical fiber waveguide 13. The optical coupling between the optical fiber and the transmitters or receivers is generally done with lenses which are not shown in the drawing. The light that is coupled into the near end of the optical fiber waveguide 13 is guided along the optical fiber waveguide 14 and exits out the far end of the optical fiber waveguide 15. The light exiting from the far end of the optical fiber waveguide 15 is split at the beamsplitter 16 where 50% of the light is directed towards the light receiver 17 and 50% is directed towards the light transmitter 18. Only 25% of the light emitted by light transmitter 18 is detected by light receiver 12, and only 25% of the light emitted by the light transmitter 10 is detected by the light receiver 17.

One of the drawbacks of the optical link shown in FIG. 1 is that 75% of the light emitted by the optical transmitters is lost because of the use of the beamsplitters. An alternative optical system which avoids 75% optical power loss is shown in FIG. 2. Light transmitter 19 emits light which is coupled into the near end of the optical fiber waveguide 20. The light travels through the optical fiber Waveguide 21 where it exits out the far end of the optical fiber waveguide 22 where the light is detected by light receiver 23. For signal transmission in the opposite direction, light transmitter 24 launches light into the near end of the optical fiber waveguide 25, where it travels through the optical fiber waveguide 26, exits out the far end of the optical fiber waveguide 27, and is detected by the light receiver 28. Note that the optical system shown in FIG. 2 is two optical fiber links run in parallel but opposite directions.

Figure 3:
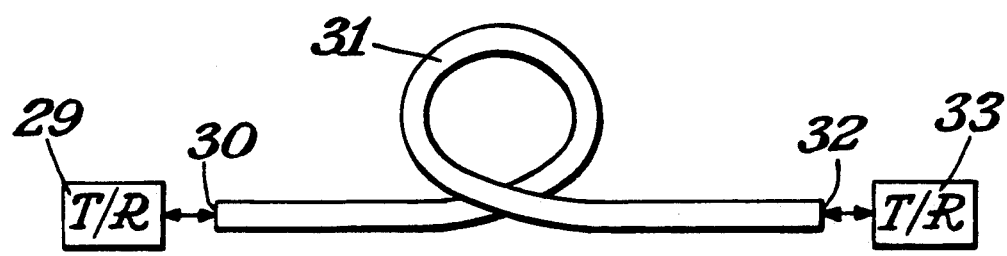

The use of a single emitter/detector diode as both transmitter and receiver, as shown in FIG. 3, avoids the optical power loss of FIG. 1 and requires only one optical fiber instead of two as are required in the system of FIG. 2.

2. Description of Related Art

In general, there are trade-offs involved in designing a semiconductor diode to be used as both an emitter and as a detector of optical signals. For example, an efficient light emitter needs a low absorption coefficient so most of the light is emitted external to the device and is not absorbed internally. In contrast, an efficient light detector needs a large absorption coefficient so most of the light is absorbed within the device and does not pass through the device. However, a diode device with a low absorption coefficient can increase its capabilities for absorbing light by reverse biasing the diode. The reverse bias applies an electric field across the semiconductor diode which bends the semiconductor's energy bands causing an effective increase in the absorption coefficient. This is known as the Franz-Keldysh effect.

An invention utilizing the Franz-Keldysh effect has been disclosed by R. G. Hunsperger in U.S. Pat. No. 3,952,265, "Monolithic Dual Mode Emitter-Detector Terminal for Optical Waveguide Transmission Lines." A subsequent invention, also utilizing the Franz-Keldysh effect, has been disclosed by J. H. Park and R. G. Hunsperger in U.S. Pat. No. 4,773,074, "Laser/Detector Diode for Optical Fiber Transmission Lines." Those patents describe edge-emitting diodes where the light is emitted along the junction plane and out the side of the diode. Edge-emitting diodes couple most efficiently to single-mode optical fibers where the fiber core diameter is less than 10 micrometers. However, for multimode optical fibers where the core diameter is typically 50 micrometers or greater, it is difficult to couple the light from the fiber into the edge-emitting diode. (For a dual function diode, a high coupling efficiency is desired both from emitter/detector to fiber during transmit mode and from fiber to emitter/detector during receive mode.) For low data rate applications where multimode optical fibers are used, a more efficient dual function diode would utilize a top or front surface emitting diode structure. In a surface-emitting diode, the light is emitted perpendicular to the junction and out of the top of the diode. The surface-emitting/detecting diode achieves higher coupling efficiencies to multimode fibers than the edge emitting/detecting diode.

A device utilizing a surface-emitting/detecting structure is the subject of pending application U.S. Ser. No. 07/247,042 "Dual Mode Light Emitting Diode/Detector Diode for Optical Fiber Transmission Lines" by Garfield Simms and R. G. Hunsperger. That device also utilizes the Franz-Keldysh effect for increasing the detector sensitivity during receive mode. One of the consequences of using a device that depends upon the Franz-Keldysh effect is that a reverse bias voltage must be applied to the diode during receive mode. This applied reverse bias voltage is often very large which can increase the cost of the driver circuitry by requiring extra power supplies.

It is an object of the present invention to provide a diode device for light emission under forward bias and for light detection under zero bias or a very low reverse bias utilizing a multi-bandgap structure wherein a narrow bandgap semiconductor material is used for light detection, a medium bandgap semiconductor material is used for light emission, and a large bandgap semiconductor material is used for a window layer.

Figure 4:
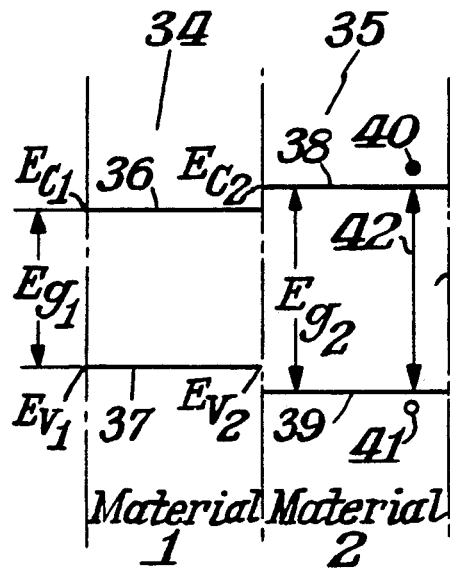
FIGS. 4, 5, and 6 are energy band diagrams illustrating energy changes occurring between electrons and holes in photodiodes.
Figure 5:
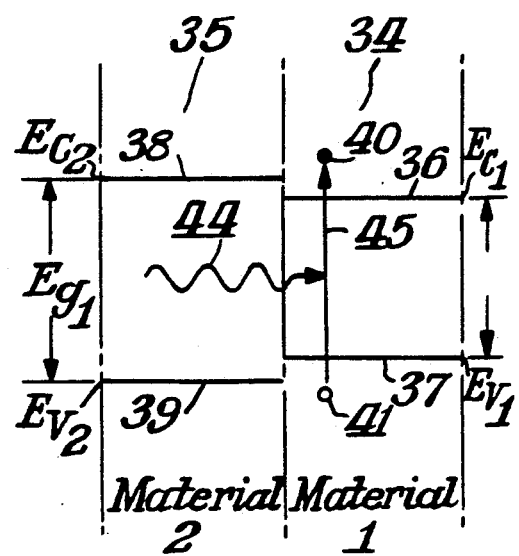

The present invention provides for both emission and detection in a material by combining two separate materials in which one material is the emitter and the other material is the detector. The effect of the present invention is illustrated in FIGS. 4 & 5. FIG. 4 shows diagrammatically the relative bandgap energies of two different materials. The bandgap energy of semiconductor material 34 is less than the bandgap energy of semiconductor material 35. The bandgap energy ($E_{g1}$) of semiconductor material 34 is the energy difference between the bottom of the conduction band 36 (denoted $E_{c1}$) and the top of the valence band 37 (denoted $E_{v1}$). Similarly, the bandgap energy ($E_{g2}$) of semiconductor material 35 is the energy difference between the bottom of the conduction band 38 (denoted $E_{c2}$) and the top of the valence band 39 (denoted $E_{v2}$). Generally when an electron from the conduction band combines with a hole from the valence band a photon of light is emitted at an energy approximately equal to the bandgap energy. This process is shown in material 35 in which electron 40 and hole 41 recombine (denoted by the downward transition arrow 42) and a photon of light is emitted (denoted by the wavy arrow 43) The energy of the photon, $E_{photon}$, is approximately equal to the bandgap energy ($E_{g2}$).

In general, a photon is absorbed in a semiconductor material (i.e light is detected) only when the energy of the photon is greater than the bandgap energy of the semiconductor. FIG. 5 depicts a photon of light 44 incident on the identical two materials shown in FIG. 4. In this example the photon is not absorbed in material (35) because $E_{photon} \approx E_{g2}$, but the photon is absorbed in material (34) because $E_{photon} > E_{g1}$. The material absorption process is denoted by upward transition arrow 45.

Figure 6:
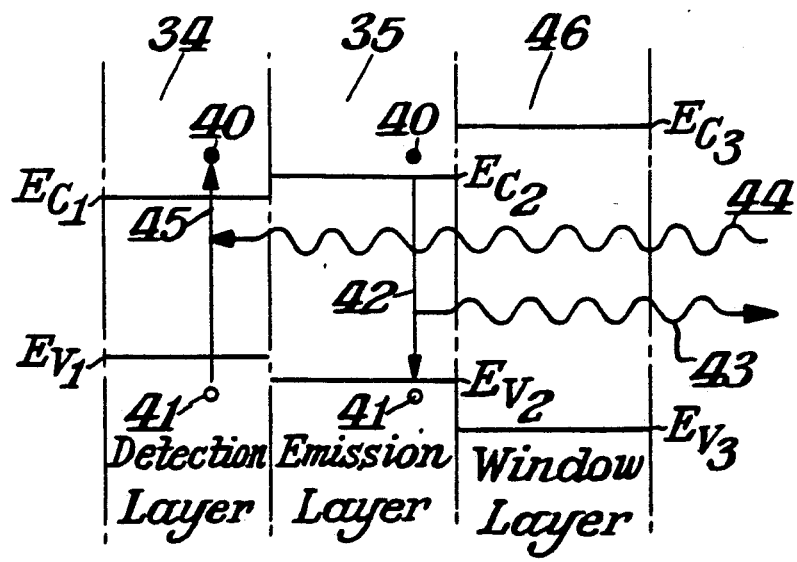

FIG. 6 represents the emitter detector diode at one end of an optical communication link utilizing the same device structure for the emission of light and the detection of the same emitted light. Note that separate materials are used for the emission and detection of light. Namely, the material 34 is the detection layer A and material (35) is the emission layer B. A third "window" layer C is added next to the emission layer B as shown in FIG. 6. The window layer of material 46 is transparent to light if the energy of the light, $E_{photon}$, is less than the bandgap energy of the layer C, $E_{g3}$ where $E_{g3} = E_{c3} - E_{v3}$. The window layer C would not affect the transmission or reception of photons but could improve the efficiency and structural integrity of the device.

A bidirectional optical communication link that uses an optical transmission medium between two dual function emitter/detector semiconductor diodes according to this invention is shown in FIG. 3. A light emitting diode and the electronic circuit that drives the diode constitutes a light transmitter. A photodiode detector and the electronic circuit that drives the photodiode constitutes a light receiver. Thus, one dual function light emitting/detecting diode and the electronic circuit that drives the diode constitutes a light transmitter/receiver. The light transmitter/receiver emits an optical signal by applying a forward bias to the emitter/detector diode. The light transmitter/receiver is capable of detecting an optical signal by applying a zero or small reverse bias to the emitter/detector diode. The bidirectional optical fiber link shown in FIG. 3 operates as follows. Light transmitter/receiver 29 is switched to transmit and light is emitted onto the near end of the optical fiber waveguide 30. The light travels through the optical fiber waveguide 31 and exits out the far end of the optical fiber waveguide 32. Light transmitter/receiver 33 is switched to receive so the light exiting from the far end of the optical fiber waveguide 32 is detected by light transmitter/receiver 33. To send a signal in the opposite direction light transmitter/receiver 33 is switched to transmit and light transmitter/receiver 29 is switched to receive.

BIDIRECTIONAL OPTICAL FIBER LINK

A significant cost savings is realized by using the bidirectional optical fiber link shown in FIG. 3 as opposed to either of the bidirectional optical fiber links shown in FIGS. 1 and 2. First, only two emitter/detector diodes are needed in the system shown in FIG. 3, whereas two emitter diodes and two detector diodes are needed in each of the other systems shown in FIGS. 1 and 2. Further, the optical system shown in FIG. 3 does not need any beamsplitters, as in FIG. 1, nor does it need an extra optical fiber waveguide, as in FIG. 2. In addition to lowering the cost of the system, reducing the number of components required can be expected to improve overall system reliability. The present invention provides efficient dual emitter/detector diodes in the system shown in FIG. 3 to provide a viable alternative to the systems shown in FIGS. 1 and 2

SUMMARY OF THE INVENTION

This invention provides an optical transmission system in which a semiconductor diode device performs the dual functions of emission and detection of optical signals with the detection mode requiring a small to none reverse bias on the diode device. An optical transmission medium, such as an optical fiber, for transmitting optical signals is positioned to deliver and receive signals at a lateral surface of the diode, which surface is generally parallel to the diode p-n junction. The diode device is comprised of at least two semiconductor regions, one of which is positioned closer to the optical transmission medium than the other. The first region positioned closer to the medium is a p-type semiconductor material having a relatively wide energy bandgap width. The second region positioned further from the medium is a n-type semiconductor material having an energy bandgap width which is narrower than that of the first region. The two regions are in electrical contact to form a p-n junction.

The system has a switch means for electrical contact to an electrical forward bias voltage for an optical emission mode or to a zero bias or a low reverse bias for an optical detection mode. In this system the narrow energy bandgap width material provides light detection while the wider energy bandgap width material provides light emission.

DESCRIPTION OF THE PREFERRED EMBODIMENT OF THE INVENTION

The emitter/detector diode of this invention consists of three layers of varying bandgap semiconductor material grown on a substrate of semiconductor material. The three layers are, respectively, a window layer of large bandgap width material, an emission layer of medium bandgap width material, and a detection layer of narrow bandgap width material. The layers are ordered in such a manner so that light impinging on the diode device travels first through the window layer, then through the emission layer, and finally the light is detected in the detection layer. In contrast, during transmit mode, light is emitted from the emission layer, travels through the window layer and exits the emitter/detector diode.

Figure 7:
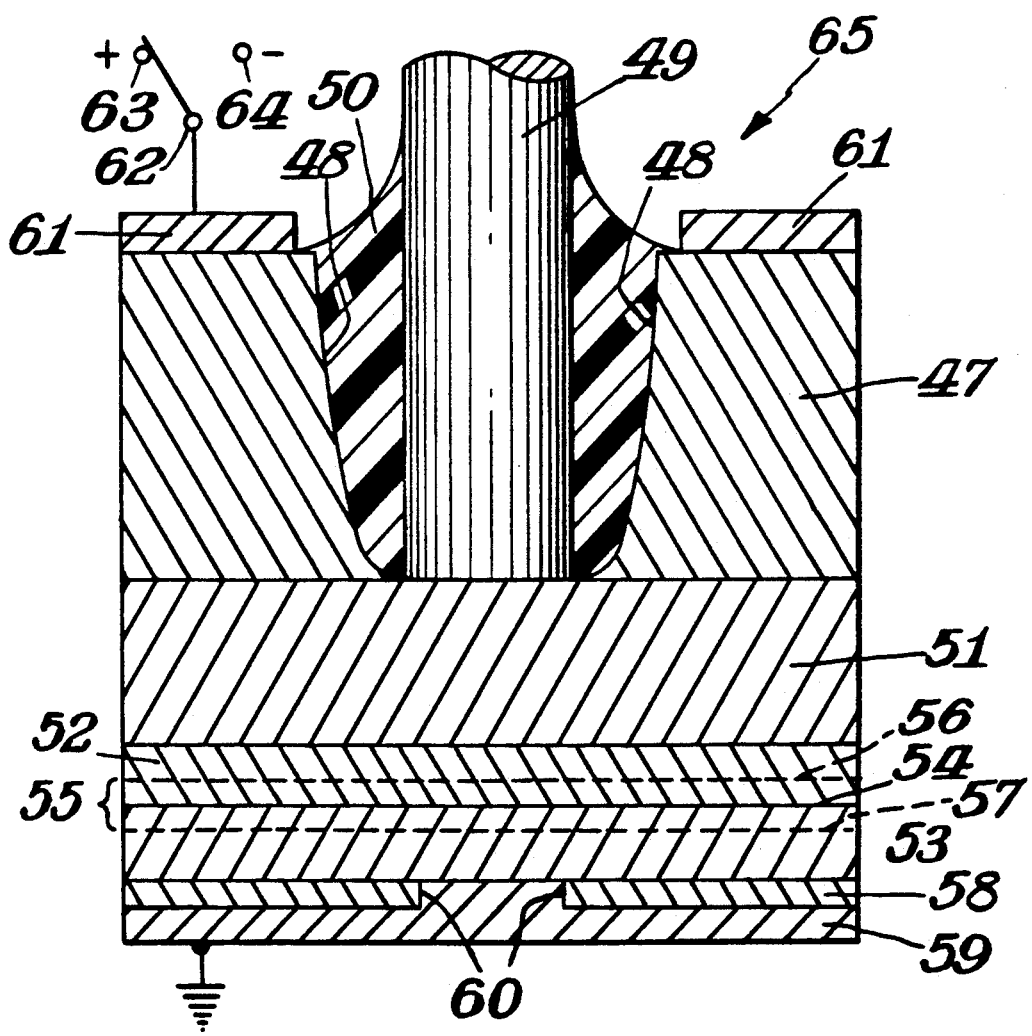
FIG. 7 is a sectional view of an emitter-detector diode device according to the present invention.

FIG. 7 is a schematic cross-sectional view illustrating the layered structure embodiment of an emitter/detector diode device 65 according to the present invention. FIG. 7 shows a p-type GaAs substrate 47 having a well 48 receiving an optical fiber 49. The well 48 is filled with an epoxy 50 to secure and fasten the optical fiber 49 to the substrate 47. Supported on the substrate 47 is a p-type aluminum gallium arsenide window layer 51 of Composition $Al_xGa_{1-x}As$ wherein the subscript x denotes the percent concentration of AlAs and 1-x denotes the concentration of GaAs. The larger the percent concentration of AlAs in AlGaAs the wider the energy bandgap. Here, window layer 51 is chosen to have 30% AlAs concentration and 70% GaAs concentration. A p-type $Al_yGa_{1-y}As$ emission layer 52 is formed on the window layer 51. The AlAs concentration y is chosen to be 3% in the emission layer 2 which would give a light emission wavelength of approximately 850 nm. An n-type GaAs detection layer 53 forms a p-n junction interface 54 with emission layer 52. The depletion region 55 of the p-n junction extends from demarcation line 56 in the emission layer 52 to demarcation line 57 in the detection layer 53. The depletion region 55 is the extent of region surrounding the p-n junction interface 54 in which the material is depleted of mobile charge carriers. As shown in FIG. 7 optical fiber 49 is vertically oriented in relation to the horizontal alignment of the diode p-n junction interface 54 so that the optical signals transmitted in the optical fiber 49 are directed substantially normal to the lateral surface of layer 51 and the p-n junction interface 54.

A silicon dioxide isolating layer 58 lies between the detection layer 53 and a metallization ground contact 59. An opening 60 is etched through the silicon dioxide layer 58 to allow the metallization electrode 59 to contact the detection layer 53. The metallization contact 59 is connected to ground and metallization contact 61 on the substrate 47 is connected through a switch 62 to a source of positive voltage 63 or alternatively to a source of zero or negative voltage 64. This switch 62 is preferably an electronic switching circuit. According to this invention the optical detection mode employs no bias at all or when under reverse bias, preferably a negative voltage of not more than 5 volts.

In a specific embodiment of the present invention in the diode device 65 the window layer 51 has a thickness in the range of 5 to 20 $\mu$m and p-type concentration of $10^{17}/cm^3$. The emission layer 52 has a thickness of 1 $\mu$m and a p-type concentration of $10^{18}/cm^3$ and the detection layer has a thickness of 1.5 $\mu$m with an n-type concentration of $10^{16}/cm^3$.

Figure 8:
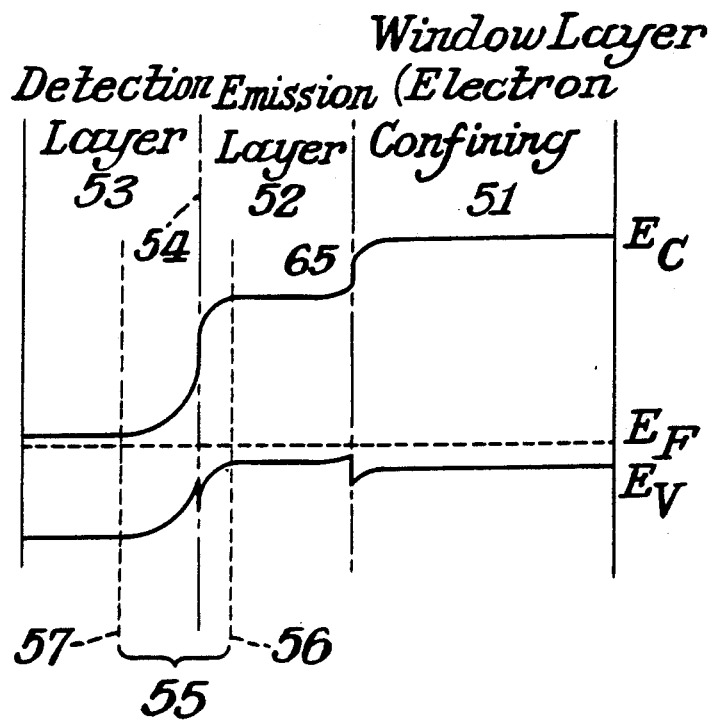
FIG. 8 is an energy band diagram illustrating energy changes in the diode device of FIG. 7.

FIG. 8 is an energy band diagram of the structure of FIG. 7. The bandgap of the window layer 51 is larger than the bandgap of the emission layer 52 which is larger than the bandgap of the detection layer 53. The extent of the depletion region 55 is defined as the region surrounding the p-n junction interface 54 where the energy bands are curved. Demarcation lines 56 and 57 identify the extent of the depletion region. The window layer also acts as an electron confining layer. The electrons are confined to the emission layer by the step in the conduction band 65 that occurs at the interface between the emission layer 52 and the window layer 51.

The use of one carrier confining layer, such as the electron confining layer in FIG. 8, defines what is commonly called a single-heterostructure (SH) diode device. A single-heterostructure light emitting diode (SH-LED) is more efficient and emits more light than a homojunction LED. However, with both an electron confining layer and a hole confining layer even larger light output power levels are achieved. These double-heterostructure (DH) LEDs are also more efficient than the SH-LEDs. Most commercially available lasers and LEDs use this double-heterostructure design to achieve the high efficiencies and large output power levels they provide. However, a DH-LED is inefficient as a detector of light.

A light detector diode requires a means for absorbing a photon, thereby creating an electron-hole pair, and a means for separating the electron-hole pair, thereby creating a current in an external circuit. The electron-hole pair is generally separated with an electric field, the electron drifts against the electric field and the hole drifts with the electric field. In a conventional photodiode the electron-hole pair is separated by the electric field that exists in the depletion region. The depletion region is the region surrounding the p-n junction interface where an electric field exists which is indicated by the curvature of the bands in an energy band diagram.

Figure 9:
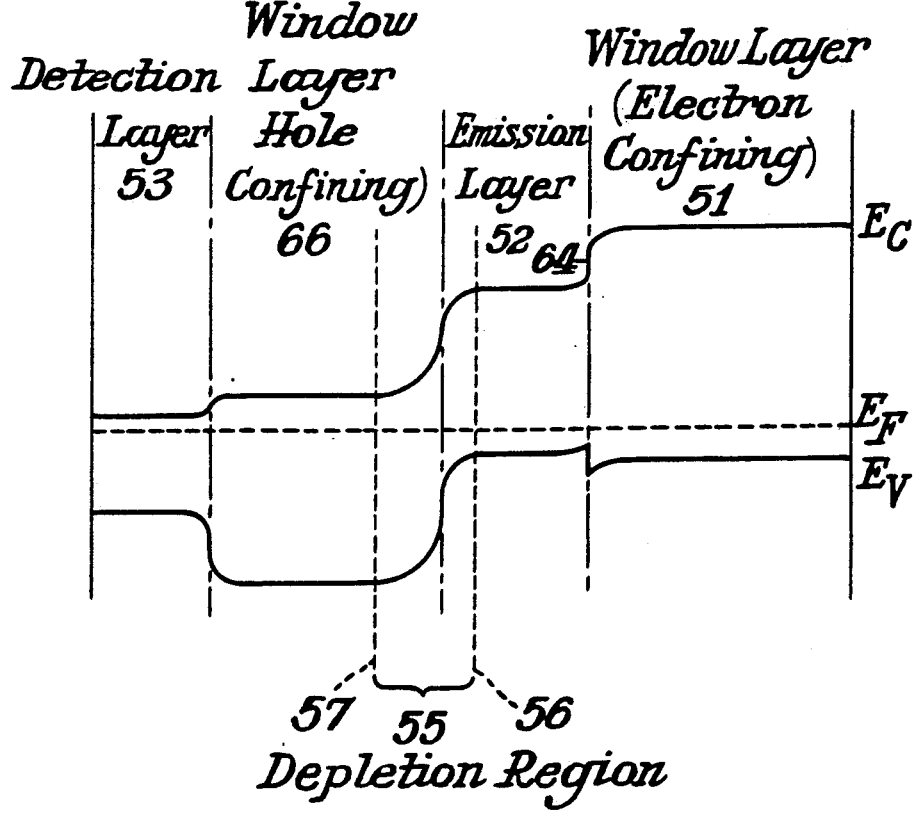
FIG. 9 is an energy band diagram illustrating energy changes in a modified diode device.

FIG. 9 is an energy band diagram of a double-heterostructure LED that would be a more efficient light emitter than the structure of FIG. 7. The band diagram of FIG. 9 is identical to the band diagram of FIG. 8 except that a hole confining layer 66 has been inserted between the emission layer 52 and the detection layer 53. The p-n junction in the DH-LED band diagram of FIG. 9 occurs between the n-type hole confining layer 66 and the p-type emission layer 52. The depletion region 55 if FIG. 9 does not extend into the detection layer 53 and the energy bands are flat in the detection layer 53. Thus, an electric field does not exist in the detection layer 53 and an electron-hole pair that has been created by an absorbed photon will not separate and the external circuit will not detect a current. In contrast, the depletion region 55 of FIG. 8 does extend into the detection layer 53. Thus, an electric field does exist in the detection layer 53 and an electron-hole pair created by an absorbed photon will be separated and the external circuit will detect a current. In summary, the SH-LED device of FIG. 8 is an efficient dual unction emitter/detector diode whereas the DH-LED device of FIG. 9 would make an inefficient dual function emitter/detector diode.

We claim:

1. An optical transmission communication system having in combination
    an optical transmission medium,
    a dual function emitter/detector diode device comprised of
    a first region consisting of a semiconductor material of wide energy bandgap width having a lateral surface receiving transmission from said medium,
    a second region consisting of a semiconductor material of a narrower energy bandgap width than said first region in contact with said first region, said first region being positioned between said medium and said second region, the material of said second region being of the same conductivity type as said first region,
    a third region consisting of a semiconductor material of a narrower energy bandgap width than said second region in electrical contact with said second region, the material of said second region being of opposite conductivity type from said third region material thereby forming a p-n junction, contact means for coupling said regions to external electrical circuits, an optical wave guide coupled to the lateral surface which is arranged adjacent said first region and so constructed and arranged that the first region is interpositioned between the optical wave guide and the second and third regions, a means for electrical coupling of the diode device to an electrical forward bias voltage for an optical emission mode whereby electrons from the third region combine with holes from the second region to emit a signal from the second region to the optical wave guide, means for transmitting an optical signal from said second region, means for electrical coupling of the diode device to a reverse bias of 5 volts down to zero for an optical detection mode, whereby a light signal received by the first and second regions and passing to the third region is detected so that in optical transmission the second region provides light emission and the third region provides light detection, said semiconductor materials being doped to provide a bandgap energy in said third region enabling photon detection in the presence of a bias ranging from a reverse bias of 5 volts down to zero bias.

2. An optical transmission system as claimed in claim 1 in which said first, second and third regions are of planar configuration and the optical transmission medium is positioned normal to said planar configurations.

3. An optical transmission system as claimed in claim 2 wherein said optical transmission medium is an optical fiber.

4. An optical transmission system as claimed in claim 1 in which said first region has a p-type concentration of the order of $10^{17}/cm^3$, said second region has a p-type concentration of the order of $10^{18}/cm^3$ and said third region has a n-type concentration of the order of $10^{16}/cm^3$.

5. An optical transmission system as claimed in claim 1 wherein said semiconductor material of said first region is a p-type material having a major proportion of gallium arsenide in the aluminum gallium arsenide mixture with a minor proportion being aluminum arsenide, said semiconductor material of said second region is p-type material having a major proportion of gallium arsenide with a minor proportion being aluminum arsenide and the proportion of the aluminum arsenide to the gallium arsenide in the second region being less than the proportion of the aluminum arsenide to the gallium arsenide in the first region and said semiconductor material of said third region is n-type gallium arsenide.

6. An optical transmission communication system as claimed in claim 1 wherein said doping of said semiconductor materials provides the diode as a detector in the presence of a negative voltage of not more than 5 volts.

7. An optical transmission communication system having in combination an optical transmission medium a dual function emitter/detector diode device comprised of a first region consisting of a semiconductor material of a wide energy bandgap width having a lateral surface for receiving transmission from said medium and a second region consisting of a semiconductor material of a narrower energy bandgap width than said first region in electrical contact with said first region, said first region being positioned between said medium and said second region, the material of said first region being of opposite conductivity type from said second region material thereby forming a p-n junction, contact means for coupling said first and second regions to external electrical circuits, an optical wave guide coupled to the lateral surface of the diode device adjacent to said first region so constructed and arranged that the first region is interpositioned between the optical wave guide and said second region, means for transmitting an optical signal from said first region and a means for electrical coupling of the diode device to an electrical forward bias voltage for an optical emission mode whereby electrons from the second region combine with holes from the first region to emit a signal from the first region to the optical wave guide, means for electrical coupling of the diode device to a reverse bias voltage of $-5$ volts to zero for an optical detection mode whereby a light signal received by the first region and passing from the first region to the second region is detected in the second region so that in optical transmission the first region provides light emission and the second region provides light detection, said semiconductor materials being doped to provide a bandgap in said second region enabling photon detection in the present of a bias ranging from a reverse of $-5$ voltage down to a zero bias.

8. An optical transmission system as claimed in claim 7 wherein said semiconductor material of said first region is a p-type aluminum gallium arsenide with a lesser percent being aluminum arsenide concentration and the semiconductor material of said second region is a n-type gallium arsenide.

9. In an optical transmission system the combination of an optical fiber, and a dual function emitter/detector diode having a first layer of p-type material having a major proportion of aluminum gallium arsenide having a thickness in the range of 5 to 20 μm and a minor proportion being aluminum arsenide, a second layer of p-type material having a major proportion of aluminum gallium arsenide having a thickness of 1 μm and a minor proportion being aluminum arsenide and the proportion of the aluminum arsenide to the aluminum gallium arsenide in the second layer being of the order of one-tenth the proportion of the aluminum arsenide to the aluminum gallium than in said first layer, and a third layer of n-type gallium arsenide having a thickness of 1.5 μm, said aluminum gallium arsenide and gallium arsenide being doped to produce the diode as a detector in the present of no bias to a reverse bias of not more than $-5$ volts; and means to couple the diode and optical and electrical circuits.

* * * * *